United States Patent [19]

Yoshimura

[11] Patent Number: 4,910,415

[45] Date of Patent: Mar. 20, 1990

[54] INTERCONNECTION BETWEEN A BATTERY CELL AND A PRINTED CIRCUIT BOARD IN AN ELECTRIC APPARATUS

[75] Inventor: Yutaka Yoshimura, Nara, Japan

[73] Assignee: Sharp, Kabushiki Kaisha, Osaka, Japan

[21] Appl. No.: 339,858

[22] Filed: Apr. 17, 1989

Related U.S. Application Data

[63] Continuation of Ser. No. 558,912, Dec. 7, 1983, abandoned.

[30] Foreign Application Priority Data

Dec. 15, 1982 [JP] Japan ................................. 57-190497

[51] Int. Cl.⁴ .............................................. H01S 7/00
[52] U.S. Cl. ................................... 307/147; 361/411; 439/66; 439/75; 439/82; 439/87; 439/91
[58] Field of Search ............... 367/147, 150; 174/68.5; 361/411, 413; 439/65, 66, 75, 82, 86, 87, 91; 340/815.03

[56] References Cited

U.S. PATENT DOCUMENTS

| Re. 31,114 | 12/1982 | Berg | 361/411 X |
|---|---|---|---|
| 3,971,610 | 7/1976 | Buchoff et al. | 339/DIG. 3 X |
| 3,982,320 | 9/1976 | Buchoff et al. | 339/17 LM X |
| 3,998,512 | 12/1976 | Anhalt et al. | 339/59 M X |
| 4,002,892 | 1/1977 | Zielinski | 307/150 X |
| 4,138,672 | 2/1979 | Kepchar | 340/815.03 |
| 4,449,774 | 5/1984 | Takashi et al. | 339/DIG. 3 X |

Primary Examiner—Derek S. Jennings
Attorney, Agent, or Firm—Birch, Stewart, Kolasch & Birch

[57] ABSTRACT

An electronic apparatus comprising a power supply device such as a solar cell having at least one electrode for supplying power, a printed circuit board having at least one electrode for inputting the power from the power supply device, and an elastic, electrically conducting connector for connecting the electrode of the power supply device with the electrode of the printed circuit board. The electrically conducting elastic connector is made of silicone rubber containing carbon filler dispersed therein.

4 Claims, 2 Drawing Sheets

INTERCONNECTION BETWEEN A BATTERY CELL AND A PRINTED CIRCUIT BOARD IN AN ELECTRIC APPARATUS

This application is a continuation of application Ser. No. 06/558,912 filed on Dec. 7, 1983, now abandoned.

BACKGROUND OF THE INVENTION

The present invention relates to an electronic apparatus equipped with a battery cell and, more particularly, to an interconnection between a battery cell and a printed circuit board which is used in an electronic apparatus such as an electronic calculator or the like.

In a conventional electronic calculator having a battery cell such as a solar cell, the battery cell and a printed circuit board are connected by soldered lead lines or by contact with metal battery terminals. Accordingly, the assembly of the electronic calculator is complicated. If metal terminals are used for effecting connection, the electrodes of the solar cell may be damaged, or the metal terminals may be difficult to attach. If connected by soldering, which is a permanent type of connection the battery cell and the printed circuit board may be difficult to exchange.

SUMMARY OF THE INVENTION

With the foregoing prior art problems in mind, it is an object of the present invention to provide a simplified assembly for connecting a battery cell and a printed circuit board.

It is another object of the present invention to provide a connector made of an electrical conducting elastic material for connecting electrodes of a battery cell and electrodes of a printed circuit board which are used in an electronic apparatus.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, an electronic apparatus comprises power supply means having at least one electrode for supplying power, a printed circuit board having at least one electrode for inputting the power from the power supply means, and conducting elastic means for connecting said at least one electrode of said power supply means and said at least one electrode of said printed circuit board. The conducting elastic means is made of silicone rubber in which carbon filler is dispersed.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
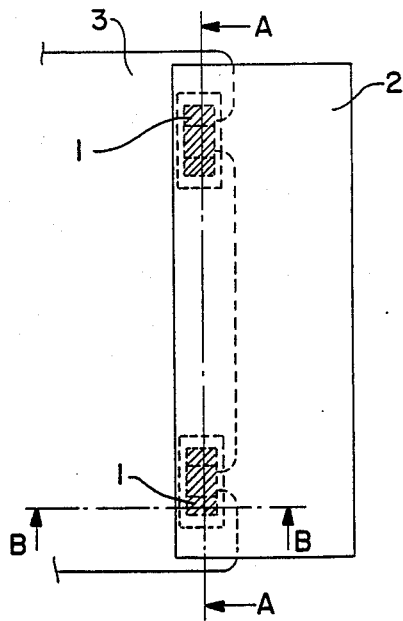
FIG. 1 is a plan view showing the relationship between a battery cell such as a solar cell and a printed circuit board when they are held in an electrical conducting relationship through the use of a connector according to an embodiment of the present invention.
Figure 2:
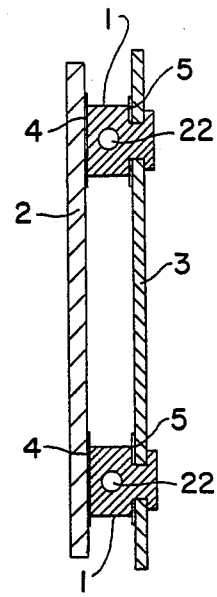
FIG. 2 is a cross-sectional view taken along line A—A of FIG. 1.
Figure 3:
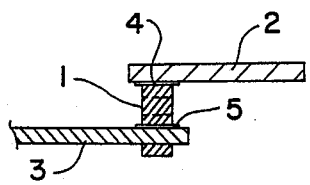
FIG. 3 is a partial cross-sectional view taken along line B—B of FIG. 1.

FIG. 1 is a plan view showing the relationship between a battery cell such as a solar cell and a printed circuit board when they are held in an electrical conducting relationship through the use of a connector according to an embodiment of the present invention. FIG. 2 is a cross-sectional view taken along line A—A of FIG. 1. FIG. 3 is a partial cross-sectional view taken along line B—B of FIG. 1.

A connector 1 is provided to electrically connect electrodes 4 of a solar cell 2 and electrodes 5 of a printed circuit board 3. The electrodes of the solar cell 2 and the electrodes of the printed circuit board 3 are gathered on electrode areas for the solar cell 2 and electrode areas for the printed circuit board 3. The electrodes 4 of the solar cell 2 are transparent electrodes made of indium oxide or the like. Key counter contacts and a wiring pattern are provided on the printed circuit board 3.

As an example of the present invention, the solar cell 2 is illustrated although the application of the present invention is not limited to this solar cell 2. It may be possible that another power source having a primary electrode is used, the primary electrode being localized at some restricted portion, if desired, via some transit electrodes.

The connector 1 is made of an electrical conducting elastic material such as silicone rubber dispersed carbon filler. Also, cushion means 22 such as a hollow is provided in the connector 1, so that an excessive force is not supplied on the glass substrate of the solar cell 2 by the elastic force of the connector 1 by the cushion means 22. The cushion means may be a more elastical material than that material of the connector 1, except when an aperture is utilized.

Figure 4:
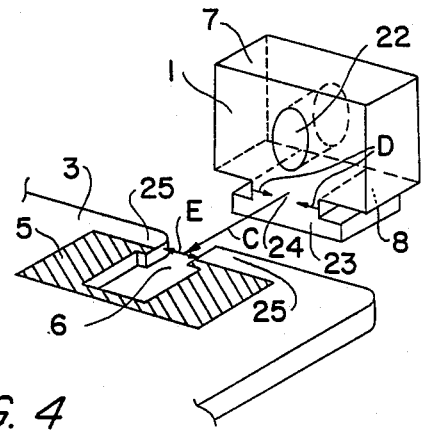
FIG. 4 is a perspective view of the printed circuit board and the connector of an embodiment of the present invention.

The connector 1 is inserted by an elastic force into a bottle-shaped opening 6 of the printed circuit board 3 provided near one end of the printed circuit board 3 in the direction of the arrow C of FIG. 4, so that the connector 1 is fixed at the printed circuit board 3 by a reverse-T foot 23 having a neck 24 of the connector 1 to connect the connector 1 and the electrodes 5 of the printed circuit board 3. The width of the neck 24 of the connector 1 is a little wider than the width E of the opening 6 of the printed circuit board 3. Accordingly, when the connector 1 is inserted into the opening 6 of the printed circuit board 3, the neck is squeezed against the projections 25, and thus is reduced in width in the direction of the arrow D. As soon as the connector 1 passes through the path of the projections 25, the neck 24 returns from its reduced shape to its original shape and thus the connector 1 is coupled with the printed circuit board 3. A surface 8 of the connector 1 is in contact with the electrodes 5 of the printed circuit board 3. A surface 7 of the connector 1 is in contact with the electrodes 4 of the solar cell 2 by elastic pressure.

Figure 5:
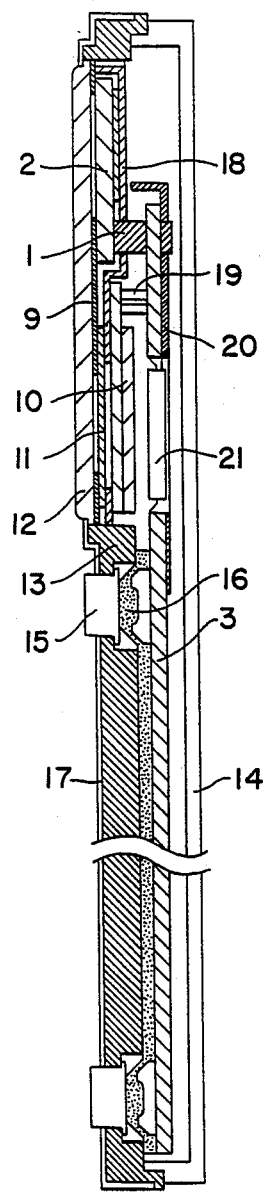
FIG. 5 is a cross-sectional view of a solar cell electronic calculator which uses a connector according to an embodiment of the present invention.

FIG. 5 is a cross-sectional view of a solar cell electronic calculator which is used with a connector according to an embodiment of the present invention.

The solar cell 2, the printed circuit board 3, a display 10 such as a liquid crystal cell and an LSI 21 are packaged by cabinets 13 and 14 (upper and lower).

In FIG. 5, 9 designates a display mask, 11 designates a reflection plate, 15 designates a key-top, 16 designates a spring rubber, 17 designates an ornamental panel, 18 designates a metal fixture for the liquid crystal cell, 19 designates a rubber connector between the liquid crystal cell 10 and the printed circuit board 3, and 20 designates a metal fixture board.

A plurality of solar cells can be used in the electronic apparatus of the present invention.

The connector 1 may include a multiplicity of elastic, resilient, conductive regions and a multiplicity of elastic, resilient, dielectric regions, both combined in alternate fashion to form a single stack.

According to an embodiment of the present invention, the solar cell and the printed circuit board are removably connected via the connector, so that an exchange of a damaged solar cell or printed circuit board is easy.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic apparatus comprising:

a power supply means having at least one electrode for supplying power, a printed circuit board having at least one electrode for inputting the power from said power supply means, said printed circuit board being provided with an opening which includes first parallel sides spaced from each other and extending from an edge of said printed circuit board, said opening further including second parallel sides spaced from each other a greater distance than said first parallel sides and being connected to said fist parallel sides in order to provide said opening with a narrow portion and a wide portion, an electrically conductive compressible elastic connecting means for providing an electrical connection between said at least one electrode of said power supply means and said at least one electrode of said printed circuit board, said electrically conductive compressible elastic connecting means includes a body having a top surface, front and back surfaces, side surfaces and a bottom surface, a foot is connected to said body by a neck, said neck includes spaced apart side surfaces parallel to said side surfaces of said body, said foot includes spaced apart side surfaces that are parallel to said side surfaces of said body and spaced further apart than the neck side surfaces, said side surfaces of said neck being spaced apart a greater distance than said first parallel sides of said opening and substantially the same distance apart as said second parallel sides of said opening, whereby said neck of said connecting means is compressed when passing through said first parallel sides of said opening and expands to substantially fill the opening between said second parallel side in an assembled position, and said bottom surface of said body and a top surface of said foot engage upper and lower surfaces of said printed circuit board, respectively.

2. The electronic apparatus of claim 1 wherein said electrically conductive compressible elastic connecting means is provided with an aperture disposed therein, said aperture adding compressibility to said electrically conductive compressible elastic connecting means.

3. The electronic apparatus of claim 2 wherein said aperture is filled with a material which contains higher elastic properties than said electrically conductive compressible elastic connecting means itself.

4. The electronic apparatus of claim 1 wherein said electrically conductive compressible elastic connecting means is made of silicone rubber containing a carbon filler.

* * * * *